(12) United States Patent
Behun et al.

(10) Patent No.: US 7,759,168 B2
(45) Date of Patent: Jul. 20, 2010

(54) ELECTROMAGNETIC INTERFERENCE SHIELD FOR SEMICONDUCTORS USING A CONTINUOUS OR NEAR-CONTINUOUS PERIPHERAL CONDUCTING SEAL AND A CONDUCTING LID

(75) Inventors: J. Richard Behun, Williston, VT (US); Erwin B. Cohen, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 12/119,654

(22) Filed: May 13, 2008

(65) Prior Publication Data

US 2009/0283876 A1    Nov. 19, 2009

(51) Int. Cl.
    *H01L 21/52* (2006.01)
(52) U.S. Cl. .................. 438/119; 438/118; 438/121; 438/124; 438/127; 257/E21.532
(58) Field of Classification Search ............ 438/118, 438/119, 121, 124, 127; 257/E21.532
    See application file for complete search history.

(56) References Cited

U.S. PATENT DOCUMENTS

| 5,763,824 | A | 6/1998 | King et al. |
| 6,136,128 | A | 10/2000 | Chung |
| 2001/0033478 | A1 | 10/2001 | Ortiz et al. |
| 2004/0240191 | A1 | 12/2004 | Arnold et al. |
| 2006/0272857 | A1* | 12/2006 | Arnold ............... 174/377 |
| 2008/0298003 | A1* | 12/2008 | Pyo ................... 361/681 |

* cited by examiner

*Primary Examiner*—Kiesha R Bryant
*Assistant Examiner*—Minchul Yang
(74) *Attorney, Agent, or Firm*—Scully, Scott, Murphy & Presser, P.C.; Anthony Canale

(57) ABSTRACT

A semiconductor package structure including a conductive adhesive material which is used to form an electromagnetic interference shield-forming Faraday cage. The Faraday cage incorporates a module lid as the top surface thereof, the conductive material as the sides and a laminate ground plane(s) or substrate as its bottom. Also disclosed is a method for fabricating the foregoing semiconductor package structure.

1 Claim, 2 Drawing Sheets

ELECTROMAGNETIC INTERFERENCE SHIELD FOR SEMICONDUCTORS USING A CONTINUOUS OR NEAR-CONTINUOUS PERIPHERAL CONDUCTING SEAL AND A CONDUCTING LID

BACKGROUND OF THE INVENTION

1. Field of the Invention

The present invention relates to a semiconductor package structure comprising a conductive tape which is used to form an electromagnetic interference shield-forming Faraday cage, wherein the Faraday cage incorporates a module lid as the top surface thereof, the conductive tape as the sides and a laminate ground plane(s) or substrate as its bottom. The present invention also discloses a method for fabricating the foregoing semiconductor package structure.

2. Description of the Related Art

Currently, the Federal Communications Commission (FCC) requires that electronics products, which are commercialized, and used in the United States, meet rigorous standards in limiting their emissions of electromagnetic interference (EMI). Hereby, the spectrum of regulated electromagnetic emissions reaches up to 40 GHz; whereby on-chip and on-module signal speeds of 3, 5 and 8 GHz are fairly common. These high-speed signals radiate at up to 10× their signal rates. Semiconductor products evince a larger amount of GHz frequency emissions than ever before; whereby a wide range of chips, extending from server systems to consumer chips, has encountered costly release or approval delays because they have failed the requisite EMI standards.

Normally, electromagnetic radiation (EM) can be contained inside a hermetically-sealed conductive enclosure, however, in the presence of any holes in that enclosure, they will radiate wavelengths less than or equal to twice the length of the opening, such that higher frequencies can escape from smaller holes. Thus, a 10 GHz signal will radiate from holes, which are larger than 15 mm. A bare die or chip on a module has essentially no enclosure, and will radiate freely in an unobstructed manner. Heretofore, a commonly employed solution has been to position a conductive lid upon the chip, and then connect the lid to the ground for the chip. More recently, conductive posts have been introduced between the surface of the laminate substrate and the lid, whereby an 8-post design is employable and halves the size of the aperture, such that a 40 mm package with 8 posts provides a partial shielding for EMI of up to 7.5 GHz. The laminate may be equipped with surface ground pads, whereby the pads are required to have a BGA (ball grid array) located directly beneath wired to ground. In that case, the posts are made of a conductive adhesive material.

Various consumers for the electronic packages are insisting on protection against EMI to levels above and beyond this 7.5 GHz because of the increased frequency content on their chips inside the package and are requesting a solution with an increased number of posts, such as 16. This, however, is problematic on several levels, inasmuch as firstly, each post requires a specific lateral clearance, which makes tighter placement increasingly difficult and driving adhesive and dispense development, while secondly, each post requires a signal BGA to be converted to ground, thereby reducing the allowed signal count for a given package. Finally, discrete posts with gaps between them create a permeable barrier to EM radiation.

Thus, Chung, U.S. Pat. No. 6,136,128, discloses a method of making an adhesive pre-formed lid for electronic devices, which is adapted to reduce or potentially even eliminate EM radiation. However, Chung does not disclose the structure and method pursuant to the present invention, wherein a novel Faraday cage serves as a two-way EM barrier.

SUMMARY OF THE INVENTION

Accordingly, pursuant to the invention, a unique and novel barrier structure shields the gap between the lid and laminate substrate with a solid strip of a conductor, such as of copper or aluminum. The conductor adheres to both the lid and the laminate, completely sealing the periphery, or at most leaving a small breathing gap. Hereby, a barrier of this type will provide a strong degree of shielding of up to 150 GHz, which is deemed to be adequate for multiple generations of modules and is well beyond both the theoretical and practical shielding capability of prior art post systems. The size and completeness of the inventive solid shield will allow some relaxation of the resistance requirement compared to the presently employed post solution, and, resultingly, will free up more BGA pins for signals.

The inventive shielding utilizes existing technology components in essentially new and inventive configurations. Pressure sensitive adhesive backed Cu and Al tapes are commercially available, which eliminates the need for developing enhanced adhesives and adhesive dispensing systems. Additionally, the EMI shield can be attached to lids, which are designed using present lid and module ground rules. The laminate or substrate designs need to be modified only to the extent to expose ground contacts on the top surface thereof. Moreover, the invention does not increase the height, length or width of the overall module.

In particular detail, the present invention is directed to forming a novel structure, which reduces or meliorates to a significant extent the effects of external electromagnetic radiation, which would adversely affect the functioning of the semiconductor package. In essence, this contemplates the provision of a Faraday cage with the module lid as its top surface, the solid conductor as the sides thereof and the laminate ground plane(s) or substrate as its bottom. The Faraday cage serves as a 2-way EM barrier, whereby the chip and laminate EM radiation magnitude and bandwidth will be reduced, and, additionally, the chip will be protected from the effects of external EMI.

BRIEF DESCRIPTION OF THE DRAWINGS

Reference may now be made to the following detailed description of an exemplary embodiment of the present invention, taken in conjunction with the accompanying drawings; in which.

DETAILED DESCRIPTION OF THE INVENTION

Figure 1:
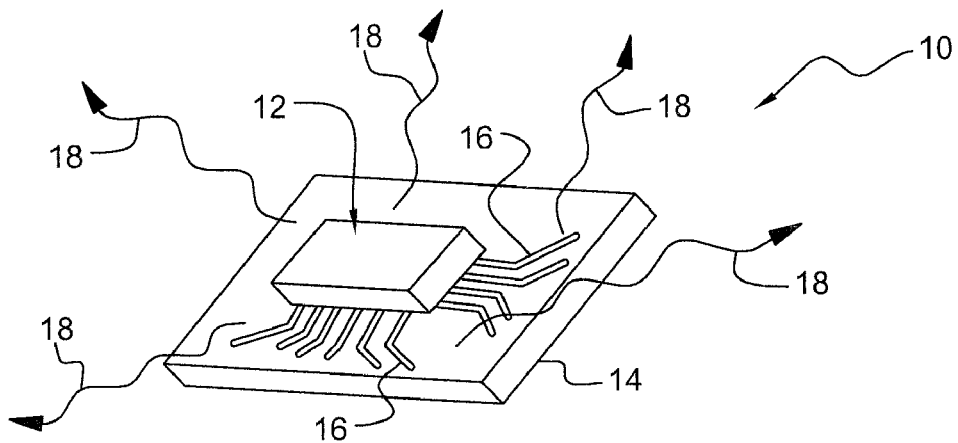
FIG. 1 illustrates, generally diagrammatically, a lidless module, pursuant to the present state-of-the-technology.

Referring in particular to detailed aspects, diagrammatically illustrated in FIG. 1 is a lidless module 10, pursuant to the prior art, including a chip 12 mounted on a laminate or substrate 14, representing an unshielded EMI structure, wherein no EMI protection is afforded. In that instance, EMI radiation radiates from the electrical components 16 in multiple wavelengths and directions, as shown by the arrows 18, in the absence of any protection.

Figure 2:
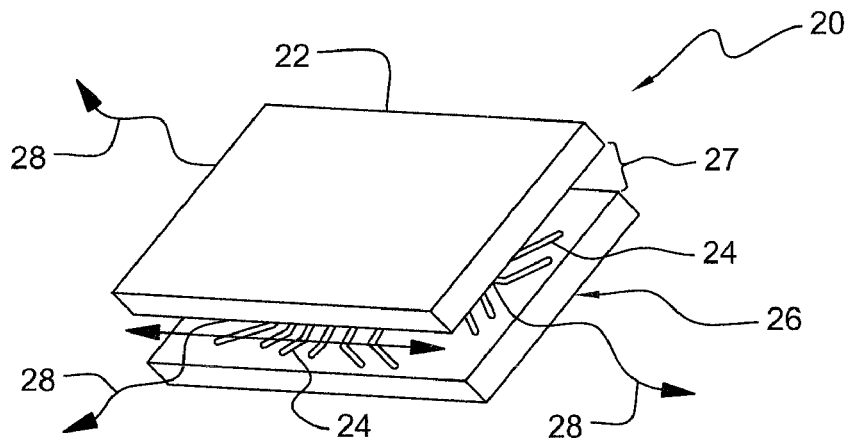
FIG. 2 illustrates, generally diagrammatically, a lidded module which is constructed pursuant to the present state-of-the-technology.

Similarly, pursuant to the prior art, in the event of utilizing a lidded module 20 where the lid 22 is electrically grounded, as shown in FIG. 2 of the drawings, the laminate 26 with the lid having an aperture 27 equal in size to the package, including the chip structure thereon, there is produced radiation by the chip and electrical components 24 along arrows 28 in fewer wavelengths and directions, although still not affording an adequate shielding against EMI.

Figure 3:
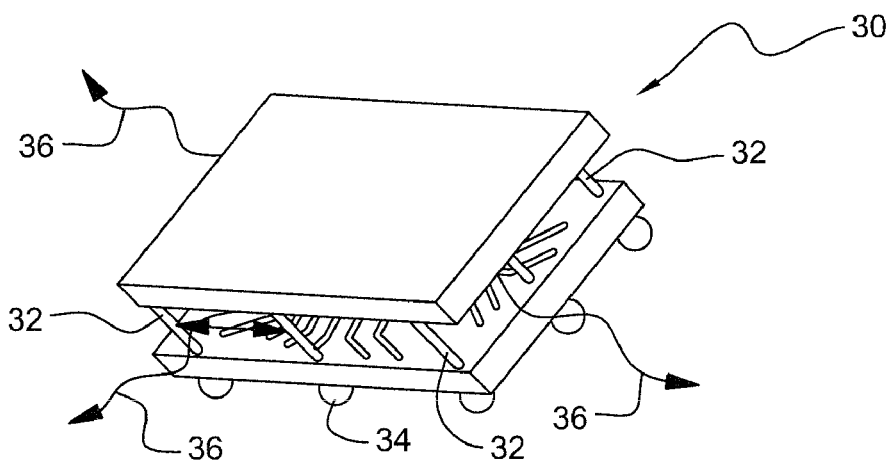
FIG. 3 illustrates, generally diagrammatically, a lidded module including posts, in accordance with the present state-of-the-technology.

As shown in the prior art configuration of FIG. 3, representing a lidded module 30 with (conductive) posts 32, which are aligned with grounded BGAs 34, in that instance, eight (8) posts 32 grounded in nature are shown for the chip on laminate structure. This structure blocks radiation of shorter wavelengths than the configuration of FIG. 2, as shown by arrows 36, but still does not provide for full protection against unwanted EMI radiation.

Figure 4:
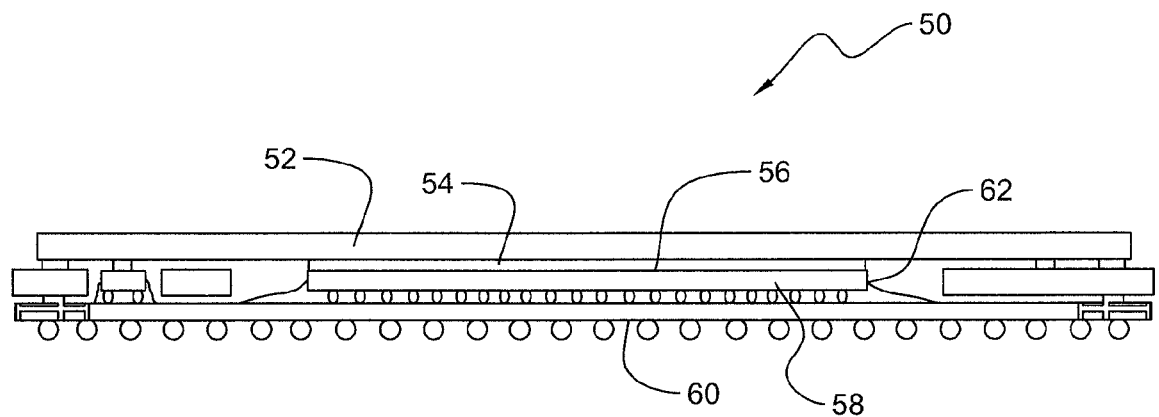
FIG. 4 illustrates, generally diagrammatically, a side view of the grounded lid with posts, pursuant to the present state-of-the-technology.

Pursuant to the known technology, as also shown in FIG. 4, only applicable components are described hereinbelow, a side view of a module 50 shows the lid 52 with a grounded electrical connection 54 between the lid and a stiffener, a die or chip structure 58 being supported on a laminate carrier 60 having an adhesive 62 interposed thereon, and where the lid is grounded to an adhesive, which is of a thermal nature. Again, there is inadequate structure provided in that module to implement a solid barrier against EMI radiation, particularly that derived from external sources.

Figure 5:
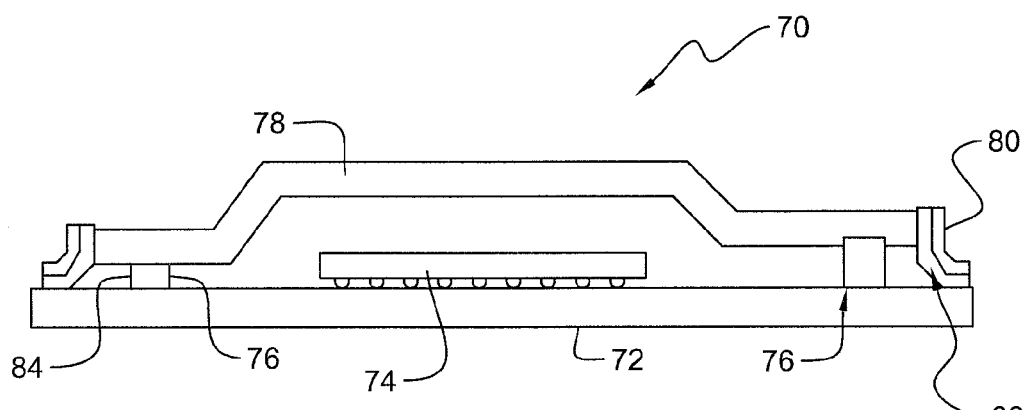
FIG. 5 illustrates, generally diagrammatically, a cross-sectional representation of the inventive shield configuration in the form of a Faraday cage, forming a protective structure against EM radiation.

Pursuant to the present invention, as illustrated in FIG. 5 of the drawings, a module 70 has a laminate or substrate 72 with a die or chip 74 positioned thereon. A lid bond 76 connects a one-piece lid 78, which is superimposed thereon, and is encompassed, or partially encompassed, by a conductive shield 80. Adhesive conductive material 82 interposed between the conductive shield 80, the laminate 72, and the lid 78, so to sealingly form, or partially sealingly form, a closed structure.

The adhesive conductive material 82 may be in the form of a tape, creates a Faraday cage, wherein the maximum frequency is limited by the size of the gap, or gaps, in the conductive shield 80. Thus, a 1 mm gap in the conductive shield will block radiation of wavelength longer than 2 mm, or 150 GHz in air.

Any electrically conductive lid 78 can be used, such as a one-piece lid.

The sides of the Faraday cage can be made with a precut adhesive-backed conductive tape. For example, these tapes are available from 3M in ⅛ inch widths; commercially designated as Material 1126, 35 µm Cu, 88 µm with adhesive, Material 1170, 50 µm Al, 81 µm with adhesive, Material 1181, 35 µm Cu, 66 µm with adhesive, or alternatively, Fabric-backed materials are readily available for providing an enhanced durability. Moreover, the sides of the Faraday cage can also be produced by being dispensed as a viscous fluid that cures into a conductive solid state. Also, tape-based conductors can be cut and then placed into position with a rolling toolhead.

The sides of the Faraday cage contact the laminate electrically through landing pads or strips on the laminate surface. These sides can be connected locally to the ground plane of the card or a third-level package through local package vias and the package-card interconnect.

Even with a 1 mm gap, there is obtained a shielding, which extends well beyond 100 GHz, in effect, more than an order of magnitude improvement in bandwidth. From the foregoing, it becomes readily apparent that there is provided an advantageous structure in EM protection and forming an EMI barrier.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method of producing a modular arrangement for shielding semiconductors from external electromagnetic interference, said method comprising:

providing a substrate consisting of a laminated dielectric material;

locating a die comprising a semiconductor chip above said substrate;

arranging electrical interconnects between said substrate and said die so as to form connections between electrical components on respectively said substrate and said die;

superimposing a one-piece lid constituted of an electrically conductive material over said die in spaced relationship therewith;

positioning a lid bond structure between said lid and said substrate in a region surrounding said die;

locating a conductive shield so as to form a barrier to electromagnetic interference externally of said lid bond, forming a closed or partially closed structure surrounding the periphery of said lid and depending towards said substrate; and providing an adhesive conducting material sealingly between said lid edge and the surface of said substrate in sealing contact with the interior of said shield, so as to conjointly form a Faraday Cage to constitute said shielding arrangement inhibiting the passage of electromagnetic interference between said substrate and said die.

* * * * *